Nov. 18, 1958 V. W. BEARINGER 2,861,017
METHOD OF PREPARING SEMI-CONDUCTOR DEVICES
Filed Dec. 29, 1954

INVENTOR.
VAN W. BEARINGER
BY Irvin M. Haugen
ATTORNEY

United States Patent Office 2,861,017

Patented Nov. 18, 1958

2,861,017

METHOD OF PREPARING SEMI-CONDUCTOR DEVICES

Van W. Bearinger, Minneapolis, Minn., assignor to Minneapolis-Honeywell Regulator Company, Minneapolis, Minn., a corporation of Delaware Application December 29, 1954, Serial No. 478,394

2 Claims. (Cl. 148—1.5)

The present invention relates generally to an improved electrical junction for semi-conductor electrical current translating bodies such as transistors or diodes, and to the method of preparing such junctions. More specifically, this invention relates to forming an electrical junction zone of one conductivity type in a semi-conductor body having generally an opposite conductivity type, and wherein such a junction is formed by utilizing a metallic mixture which comprises as a constituent thereof a diluent material which dampens or lessens the tendency of the junction forming material to migrate into the semi-conductor body, for example, a germanium-indium mixture employed as the junction forming member in an n-type germanium semi-conductor body.

The present application is a continuation-in-part of my copending application Serial No. 383,201, filed September 30, 1953, now abandoned, entitled "Semi-Conductor Devices" and assigned to the same assignee as the present invention.

In the production of semi-conductor devices which are designed to be capable of passing large amounts of power, it is generally desirable that the areas of the electrical junction be large in order to be capable of handling a greater quantity of power. Actually, this method of increasing junction size is only a partial solution to the problem since an additional problem is created in these devices due to the tendency of the junction forming material to migrate into the semi-conductor body at an uncontrollably rapid rate, and at a slightly different rate from one point on the junction to another. This results in a finished product having poor electrical properties; for example, in junction transistor production, devices are produced which have undesirably low current amplification or $\alpha$ values, such as less than 0.9.

The $\alpha$ value of transistor devices is determined according to the equation:

$$\alpha=\frac{\partial Ic}{\partial Ie(Ec)}$$

wherein $Ic$ is the collector current
$Ie$ is the emitter current
$Ec$ is the collector voltage According to my process, an improved electrical junction is formed in semi-conductor bodies, and more particularly in production of junction transistors; for example, transistor units are produced capable of handling up to 1 ampere of current at about 28 volts.

In junction transistor production, electrical junctions are generally diffused into the semi-conductor from oppositely disposed surfaces thereof leaving a narrow barrier portion therebetween. In order that the completed unit have a high $\alpha$ value, it is essential that the diffusion interfaces be closely and uniformly spaced across the entire dimension of the interface, that is to say, the barrier portion must be consistently very thin over its entire area. Because of the lack of possible control, and the rapid rate of diffusion of conventional junction forming material into semi-conductor bodies, the desired uniform proximity is seldom achieved. Care must be taken not to allow these diffused interfaces to come into direct contact since this will short circuit the operation of the transistor; thus the low limit of distance is set by the most rapid migrating portion of the interfaces which is generally at the center portion of the junction forming member.

Due to the increased control of diffusion possible in the present invention, it is possible to produce transistors having a body portion which has a smaller thickness dimension; thickness being the dimension which separates the faces upon which the junction electrode members are mounted. This small thickness dimension enables the units to be operated at a relatively higher power level since the heat which is generated during the operation is dissipated more rapidly in this type of unit than in one of similar size but having a greater thickness dimension.

It is therefore an object of the present invention to provide a novel p-n junction forming material which forms improved diffused electrical junctions in semi-conductor bodies.

It is a further object of the present invention to provide an improved electrical junction forming material which has a slower and more controllable rate of diffusion into a semi-conductor body for purposes of forming improved electrical junctions therein.

It is still a further object of the present invention to produce improved, diffused p-n junctions and transistor bodies, these junctions producing operating units having very thin bodies, and having large and consistent alpha values, these units being capable of operation while passing large amounts of current therethrough.

I have found that the diffusion of junction electrodes proceeds at a substantially even rate along all points of the leading edge or interface thereof when the operation is carried out in accordance with the present invention. I have further found if a pure donor metal, for example, indium is utilized, the diffusion rate varies along the leading edge of the diffused portion and thus presents a parabolic leading edge, thereby causing the thickness of the boundary between the junction or barrier to vary along the extent thereof. In accordance with the present invention, a metallic electrical junction forming composition is prepared having a diluent or diffusion rate retarder which reduces the rate of diffusion of the electrical junction forming material into a semi-conductor body, such as germanium, silicon, or other suitable semi-conductor material, and consequently permits closer control in the diffusion operation. For example, I have found that an indium-germanium alloy may be utilized as the junction forming material in an n-type germanium body, the germanium contained in the indium tending to depress or retard the rate of migration of indium into the germanium semi-conductor body.

In the case of silicon, aluminum metal has been used for forming of electrical junctions, however I have found that the addition of a small percentage of silicon to the aluminum is highly beneficial. In connection with either silicon or germanium, I have found that the addition of a diluent to the junction forming member as mentioned above may be added in an amount ranging from greater than 0% up to 12% is satisfactory. Although other combinations are satisfactory, in connection with germanium, I have found that an alloy of from 3% to 8% germanium and the balance indium is desirable while an alloy of 6% germanium and 94% indium is preferable. The term "alloy" as it appears throughout the specification and claims will be understood to include true alloys as well as metallic mixtures. Another combination such as an indium-gold alloy is also suitable for use as an improved junction forming member. Similar combinations with other acceptor metals such as galium, aluminum and the like have also been found suitable in this regard.

Figure 3:
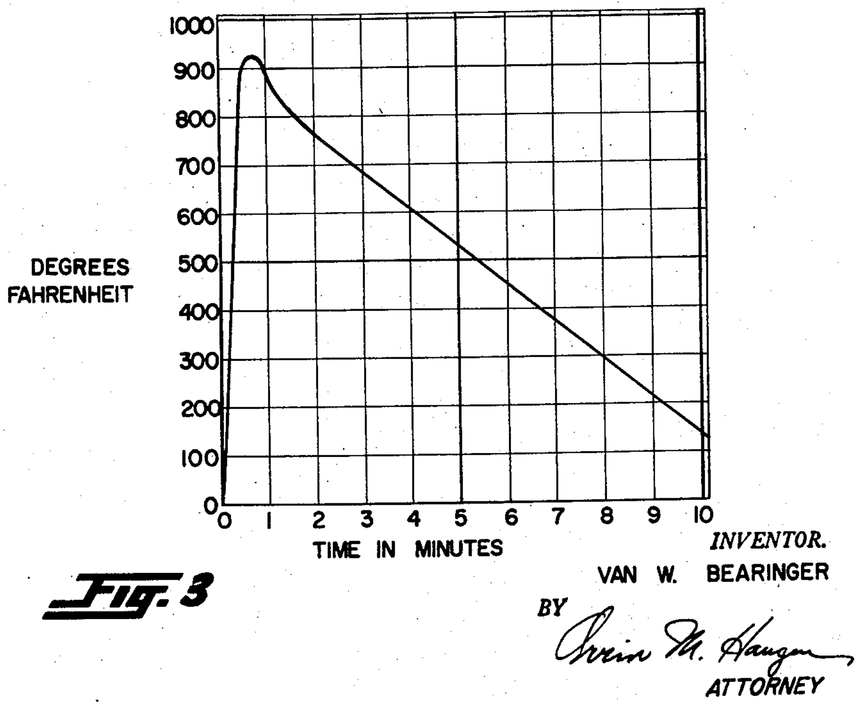
Figure 3 is a graph showing a typical heat cycle utilized in practicing the present invention, plotting the temperature against the time for diffusion of a germanium-indium alloy into an n-type germanium body.

According to the preferred modification of the present invention, a single crystal of highly purified germanium semi-conductor material doped to exhibit n-type conductivity to the extent that it has a resistivity of from 4 to 5 ohm-cm. is prepared in accordance with conventional crystal growing processes and procedures. Although the resistivity range above is that preferred for relatively high power devices, it will be understood that other ranges may be successfully used in conjunction with the present invention, such as for example, a range of from 4 to 20 ohm-cm. This crystal is then cut into slices substantially the size and shape of the desired final crystal body and the slices are then ground on a lap to present a more accurately dimensioned semi-conductor body. These ground bodies are then etched to clean the surface and improve the electrical properties thereof by means of a suitable etching solution, for example, the etching solution as disclosed and set forth in Patent No. 2,619,414 to Heidenreich. The junction forming material is then placed on top of the germanium body and held mechanically in contact therewith, for example in a graphite jig, and then subjected to a heat treatment or cycle such as a typical cycle as shown in Figure 3 of the drawings. In the case of transistors, the crystal is inverted and a second junction formed on the opposite face thereof in a manner similar to that just described. It can be seen from this graph that the temperature of the semi-conductor body is raised rapidly to substantially 925° F., thence dropped rapidly to a temperature of approximately 850° F. at which point the rate of cooling is diminished, the unit then being cooled at the rate of approximately 80° F. per minute. It is preferable to carry out this heating cycle in a hydrogen atmosphere, thus insuring against any oxidation of the semi-conductor body or constituents thereof during the heating cycle. It is believed that the slower rate of cooling from approximately 850° F. contributes to a growth of a single crystal in the area of contact between the semi-conductor body 11 and junction electrode forming members 12 and 13. After cooling, the body is again cleaned and etched to remove any surface impurities, a base electrode comprising any suitable material such as rhodium is then placed on the surface of the semi-conductor body as at 16. Leads are attached to the electrode members as at 14, 15, and 17, after which the semi-conductor body is again finally cleaned and etched to remove any surface impurities which may have come in contact with the surface of the body during the lead attaching operation.

Figure 1:
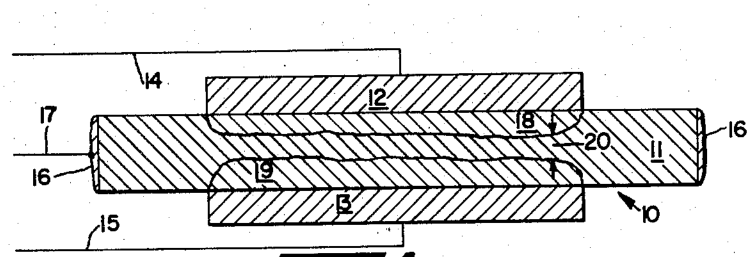
Figure 1 is a vertical sectional view taken along the lines 1—1 of Figure 2, showing a junction transistor having diffused electrical junction areas therein.
Figure 2:
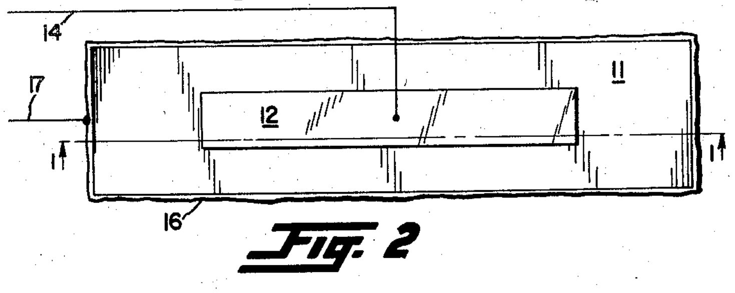
Figure 2 is a top plan view of a junction transistor produced in accordance with the present invention.

In Figure 1, a transistor 10 comprises a body 11 having electrical junction members 12 and 13 thereon, and having leads 14 and 15, respectively, attached thereto. A base electrode 16 having a lead 17 attached thereto is also shown. The diffused electrical junction areas 18 and 19, diffused inwardly from the junction electrodes 12 and 13, are separated in the interior of the semi-conductor body 11 by the barrier portion 20. It is of utmost importance in junction transistors that the dimension of the barrier portion 20 be as constant as possible. In a typical junction transistor unit, this dimension will be between substantially 1 and 2 mils.

A typical high power unit capable of operation at 1 ampere at 28 volts produced according to the present invention will have a thickness dimension of about 6 mils, and a barrier portion thickness of from 1 to 2 mils. The length and width of the transistor, although not critical, may be for example, 3/16 inch wide and 3/4 inch long. Of course, if the unit is to be utilized with a greater or lesser amount of current passing therethrough, the dimensions will be correspondingly changed.

According to a modified form of the present invention, an improved silicon electrical crystal element may be prepared. As a junction forming material for n-type silicon, an acceptor material such as aluminum is preferred; however, I have found that an alloy of aluminum and a diluent of silicon is superior for this purpose. In this connection, a suitable silicon crystal is first prepared, this crystal being prepared in accordance with conventional crystal growing procedures and having, for example, n-type conductivity and a resistivity of about 1.5 ohm-centimeters. Although other combinations are satisfactory, the 11.6% Si—88.4% Al eutectic alloy is preferred as a junction forming material. In this connection, additions of greater than 0% and up to 12% are useful, provided a homogeneous mixture can be obtained. A chunk of this alloy is prepared and mounted on the surface of the crystal as was done in the case of the indium-germanium system. In diffusing electrical junctions in the crystal, the combination is heated to a suitable temperature, for example, 1200° F. to 1300° F. and held at this elevated temperature for a sufficient period of time for diffusion to take place to the desired depth, after which the unit is cooled to room temperature. The unit is then etched in a manner similar to that practiced in connection with the indium-germanium system herein described, after which the requisite electrode leads are attached. The unit is then ready for operation.

Many details of composition and procedure may be varied without departing from the principles of this invention. It is, therefore, not my purpose to limit the patent granted on this application otherwise than necessitated by the scope of the appended claims.

I claim as my invention:

1. The method of preparing a relatively high-power electrical current translating device including an n-type body of germanium having a single crystal orientation and having an alloyed p-n junction adjacent a surface thereof, which method comprises making a pre-alloy of germanium and indium containing up to 12% of germanium, and alloying and diffusing a quantity of said prepared alloy to a controlled depth below one surface of said body to form said alloyed p-n junction in said body, said alloying and diffusing operation being conducted in a treating zone passing through a heating cycle wherein an initial elevated temperature of about 925° F. is established, this temperature being reduced rapidly to about 850° F. and thence being cooled slowly to room temperature at a rate of about 80° F. per minute.

2. The method of preparing a relatively high power alloyed junction semi-conductor current translating device including a single crystalline germanium wafer having n-type conductivity with a resistivity of from about 4 to 5 ohm-cm. and having a pair of parallelly disposed major surfaces, said method comprising the steps of preparing a pre-alloy mixture of indium and germanium containing from 3% to 8% germanium, balance indium, alloying and diffusing a quantity of said prepared alloy to an alloyed depth of from 2 to 2½ mils beneath each of said parallelly disposed major surfaces to form a pair of spaced p-n junctions in said body, said diffusing operation being conducted in a treating zone passing through a heating cycle wherein an initial elevated temperature of about 925° F. is established, this temperature being reduced rapidly to about 850° F. and thence being cooled slowly to room temperature at a rate of about 80° F. per minute.

References Cited in the file of this patent

UNITED STATES PATENTS

| | | |
|---|---|---|
| 2,485,069 | Scaff | Oct. 18, 1949 |
| 2,561,411 | Pfann | July 24, 1951 |
| 2,597,028 | Pfann | May 20, 1952 |
| 2,623,102 | Shockley | Dec. 23, 1952 |
| 2,644,852 | Dunlap | July 7, 1953 |
| 2,689,930 | Hall | Sept. 21, 1954 |
| 2,701,216 | Seiler | Feb. 1, 1955 |
| 2,701,326 | Pfann | Feb. 1, 1955 |
| 2,725,315 | Fuller | Nov. 29, 1955 |
| 2,739,088 | Pfann | Mar. 20, 1956 |
| 2,762,730 | Alexander | Sept. 11, 1956 |
| 2,765,245 | English | Oct. 2, 1956 |

OTHER REFERENCES

Armstrong: Proceedings of the Inst. of Radio Engrs., No. 11, vol. 40, November 1952, pages 1341 and 1342.